United States Patent [19]

Johnson

[11] 4,419,638

[45] Dec. 6, 1983

[54] NEGATIVE RESISTANCE ELEMENT

[75] Inventor: Kenneth C. Johnson, Cheadle, England

[73] Assignee: International Computers Limited, Stevenage, England

[21] Appl. No.: 324,432

[22] Filed: Nov. 24, 1981

[30] Foreign Application Priority Data

Nov. 27, 1980 [GB] United Kingdom ................. 8038141

[51] Int. Cl.³ ........................................... H03H 11/52
[52] U.S. Cl. ..................................... 333/217; 307/490
[58] Field of Search ................ 333/216, 217; 307/490; 179/170 G

[56] References Cited

U.S. PATENT DOCUMENTS 3,541,350 11/1970 Leutze .................................. 307/490
4,230,999 10/1980 Ahmed ............................. 333/216 X
4,323,797 4/1982 Embree et al. ....................... 307/490

OTHER PUBLICATIONS

Pookaiyaudom et al; *Accurate Syntheses of Non-Linear Resistances*, Int. J. Electronics, Feb. 1979, vol. 46, No. 2, pp. 151–156.

*Primary Examiner*—Paul L. Gensler
*Attorney, Agent, or Firm*—Lee, Smith & Jager

[57] ABSTRACT

A negative resistance element having two terminals (11, 12;) a resistor (R1-4) connected in a path between the terminals, and a current mirror arrangement (T1, T2; T3, T4;) responsive to a current flowing into the first terminal (11) to produce a current through the resistor R1-4 in such a direction as to increase the voltage of the second terminal 12 relative to the first terminal 11.

2 Claims, 2 Drawing Figures

NEGATIVE RESISTANCE ELEMENT

BACKGROUND OF THE INVENTION

This invention relates to negative resistance elements. Such elements can be considered as being of two types: voltage controlled and current-controlled. A voltage-controlled negative resistance element is defined herein as an electrical device having the property that an increase in the voltage applied across it will result in a decrease in the current flowing through it in the direction of the applied voltage (or an increase in the current flowing through it in the direction opposite to that of the applied voltage). Similarly, a current-controlled negative resistance element is defined herein as an electrical device having the property that an increase in current flowing through it will result in a decrease in the voltage drop across it in the direction of the current flow.

The object of the present invention is to provide a novel form of current-controlled negative resistance element. The invention makes use of a circuit arrangement known as a current mirror. A current mirror basically comprises two matched transistors with their bases and emitters interconnected so that the current through one is accurately reproduced in the other. Such an arrangement is described for example in British Pat. No. 1,410,021.

SUMMARY OF THE INVENTION

According to the invention there is provided a negative resistance element including first and second terminals; a current path between the terminals, a resistor means connected in the current path, and a current mirror arrangement so responsive to current flow into one of the terminals as to produce a current flow through the resistor means in such direction as to increase the voltage at the other terminal relative to said one of the terminals from the value that would prevail in the absence of the current mirror arrangement.

Preferably, the element is symmetrical so that it works equally well for currents flowing in either direction.

BRIEF DESCRIPTION OF THE DRAWING

Two negative resistance elements in accordance with the invention will now be described by way of example with reference to FIGS. 1 and 2 of the accompanying drawing, which are circuit diagrams of the elements.

DESCRIPTION OF THE EMBODIMENT

FIG. 1

Figure 1:
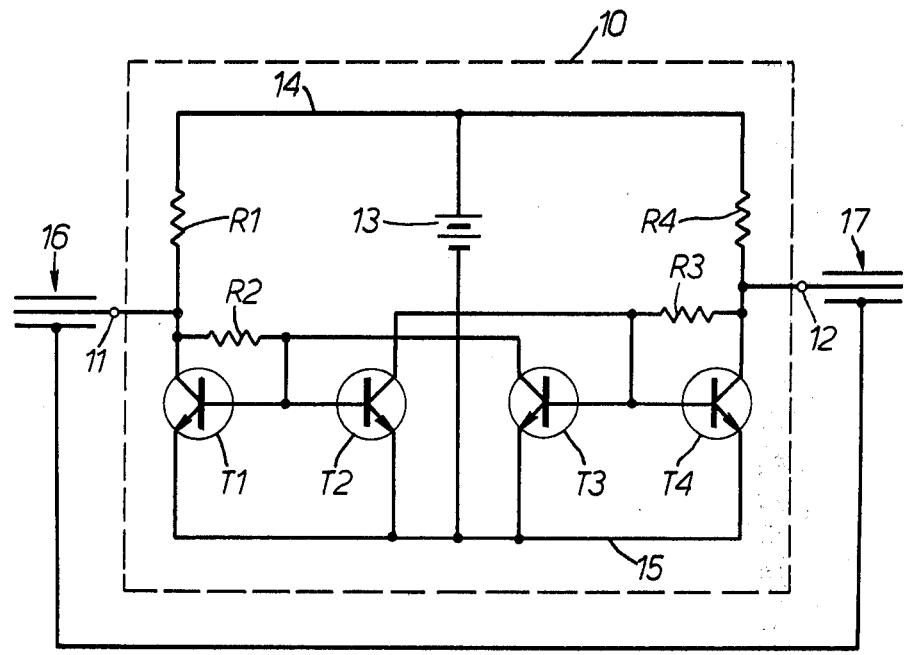

Referring to FIG. 1, the element 10 has two terminals 11 and 12. The element is powered by a 6.7 volt D.C. supply 13, the positive end of which is connected to a line 14, and the negative end to a line 15. The element comprises four NPN transistors T1-T4, the emitters of which are all connected to the negative line 15. The bases of T1 and T2 are connected together, as are the bases of T3 and T4. The positive line 14 is connected by way of a resistor R1 to the collector of T1, and by way of a resistor R4 to the collector of T4. The collector of T1 is connected by way of a resistor R2 to its own base and also to the collector of T3. Similarly, the collector T4 is connected by way of a resistor R3 to its own base and also to the collector of T2.

In this particular example, the resistors R1 and R4 are both 100 ohms, while the resistors R2 and R3 are both 200 ohms.

The areas of T2 and T3 are made accurately equal to each other (this being possible if they are formed on the same integrated circuit chip). Likewise, the areas of T1 and T4 are also made accurately equal to each other, being nine times the area of T2 and T3. In operation, T1 and T2 form a current mirror arrangement, in which the currents through the two transistors are always held in the same ratio of 9:1 as a result of the interconnection of their bases and emitters. Transistors T4 and T3 form a similar current mirror.

When no input current is present at either of the terminals 11, 12, the circuit settles down to a symmetric equilibrium (despite the cross-coupling, since the values of the cross-coupling resistors R2, R3 are sufficiently small). In this state, a current of 50 mA flows through each of the resistors R1, R4. Because the areas of T1 and T2 (and also T4 and T3) are in the ratio 9:1, each of these currents divides so that 45 mA flows through T1 (and T4) and 5 mA flows through T2 (and T3).

Now if an input current of I amps is injected into the input terminal 11, an equal current must necessarily flow out of the other terminal 12 since the element has only these two connections. The current through T1 is therefore increased whilst that in T4 is decreased, and the currents through T2 and T3 change correspondingly as a result of the current-mirror connections. As a result of these changes in current, a voltage of $\frac{1}{8}$ RI volts is developed across each of R2 and R3 (where R is the resistance of R2 and R3), so as to increase the voltage of terminal 12 relative to terminal 11 by $\frac{1}{4}$ RI volts. The element therefore acts as a negative resistance of value $-\frac{1}{4}$ R ohms (i.e. $-50$ ohms with the particular value R=200).

Since the circuit is symmetrical, it works equally well for currents flowing in the opposite direction, from terminal 12 to terminal 11.

One possible use for such a current-controlled negative resistance element is as a booster circuit for compensating for ohmic losses in communication networks. As shown in the drawing, the element 10 could be connected in series with the central conductors of two portions 16, 17 of co-axial cable. If the total ohmic resistance of the two cable portions is 50 ohms, then the net result of the series combination is a zero resistance. In other words, signals injected at either end will be received at the other end with substantially no loss in amplitude.

FIG. 2

Figure 2:
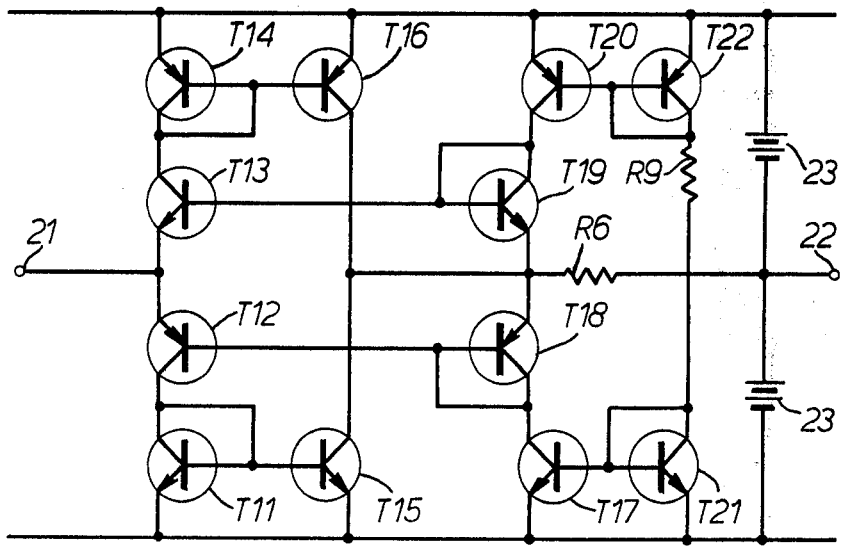

The circuit shown in FIG. 2 has two terminals 21, 22 and a 6-volt floating power supply 23. The circuit comprises NPN transistors T11, T13, T15, T17, T19 and T21 and PNP transistors T12, T14, T16, T18, T20 and T22. All the transistors have the same emitter area, except T11, T12, T13 and T14 which have N times the area of the others. (Typically N=10).

The following pairs of transistors are coupled together base-to-base as shown to form current mirrors: T11 and T15, T12 and T18, T13 and T19, T14 and T16, T17 and T21, T20 and T22.

Transistors T21 and T22 are connected in series with a 4.6K resistor R9 between the terminals of the power supply 23, and draw a substantially constant current of approximately 1 mA. As a result of the current-mirror connections, the currents through T17 and T20 are also held substantially constant at the same value. Thus, a substantially constant current of about 1 mA is supplied to the collectors of T18 and T19.

Consider first the case where there is no current flow between the terminals 21, 22. In this case, the current-mirror action of T18, T12 and T19, T13 turns on a current of approximately 10 mA in the transistors T11–T14. The current-mirror action of T11, T15 and T14, T16 therefore turns on currents of approximately 1 mA in T15 and T16. These currents are symmetrical and hence no voltage is developed across the resistor R6. The voltage between the output terminals 21, 22 is therefore zero.

If now a current is made to flow in at the terminal 21, transistors T11 and T12 are turned on more, while transistors T13 and T14 are turned on less. T15 therefore carries more current than T16 and the left-hand end of resistor R6 is pulled down in voltage. This drop in voltage acts through T18 and T19 to T12 and T13 so that the voltage at the output terminal 21 also falls, by emitter-follower action.

In summary, the passage of a current through the circuit from terminal 21 to terminal 22 causes the voltage to terminal 21 to drop relative to terminal 22. The circuit therefore acts as a negative resistance. It can be shown that the value of this negative resistance is approximately R/N where R is the value of resistor R6.

Being a current-controlled arrangement, this circuit will be stable only when the impedance presented by the external circuit is high: if a low external impedance is presented, the circuit will be unstable and will act in a non-linear manner, like a flip-flop. In a practical application, the circuit might be inserted in series in a 75 ohm cable, so that the external impedance would be 150 ohms. In this case, the values of R and N could be chosen to give a negative resistance of −20 ohms so as to offset the resistance in a length of cable having an ohmic resistance of 20 ohms.

It will be noted that whereas the circuit shown in FIG. 1 is a "Class A" design, that in FIG. 2 is a "Class B" design i.e. only the current that is actually needed is drawn from the power supply at any moment.

I claim:

1. A negative resistance element including first and second terminals; a current path through the terminals; a resistor means connected in the current path; and a current mirror arrangement so responsive to current flow into one of the terminals as to produce a current flow through the resistor means in such direction as to increase the voltage at the other terminal relative to said one of the terminals from the value that would prevail in the absense of the current mirror arrangement, in which the current mirror arrangement includes two pairs of transistors, each including first and second transistors whose bases are connected, with all of the emitters of the two pairs of transistors interconnected, and in which for each transistor pair the collector of the first transistor is electrically interconnected with its base, to one of said terminals and with the collector of the second transistor of the other pair, and in which the areas of the bases of the first transistors of the two pairs are made accurately equal to each other, whilst the areas of the bases of the second transistors of the two pairs are made accurately equal to each other with the first transistor base areas a predetermined number of times greater than the base areas of the second transistors, whereby currents through the first and second transistors of a pair are always held in the same ratio to each other as the ratio of base areas.

2. A negative resistance element as claimed in claim 1, and in which the structure of the element is such that it is symmetrical in operation so that upon reversal of current flow therethrough the element still exhibits negative resistance.

* * * * *